(12) United States Patent (10) Patent No.: US 12,669,533 B2
Cheng (45) Date of Patent: Jun. 30, 2026

(54) DETECTION DEVICE AND OPERATION METHOD THEREOF

(71) Applicant: InnoCare Optoelectronics Corporation, Tainan City (TW)

(72) Inventor: Sung-Pao Cheng, Tainan City (TW)

(73) Assignee: InnoCare Optoelectronics Corporation, Tainan City (TW)

( * ) Notice: Subject to any disclaimer, the term of this patent is extended or adjusted under 35 U.S.C. 154(b) by 501 days.

(21) Appl. No.: 18/331,952

(22) Filed: Jun. 9, 2023

(65) Prior Publication Data

US 2024/0027511 A1 Jan. 25, 2024

(30) Foreign Application Priority Data

Jul. 25, 2022 (TW) .................................. 111127682

(51) Int. Cl.
*G01R 31/08* (2020.01)
(52) U.S. Cl.
CPC ......... *G01R 31/086* (2013.01); *G01R 31/088* (2013.01)
(58) Field of Classification Search
None
See application file for complete search history.

(56) References Cited

U.S. PATENT DOCUMENTS

| | | | | |
|---|---|---|---|---|
| 5,157,769 A | * | 10/1992 | Eppley | G06F 1/26 |
| | | | | 327/321 |
| 6,966,039 B1 | * | 11/2005 | Bartz | G06F 9/451 |
| | | | | 715/764 |
| 7,480,753 B2 | * | 1/2009 | Bohm | G06F 13/4022 |
| | | | | 710/313 |
| 2019/0102334 A1 | * | 4/2019 | Berchanskiy | G06F 3/14 |

FOREIGN PATENT DOCUMENTS

| | | |
|---|---|---|
| CN | 1620030 | 5/2005 |
| CN | 107818066 | 3/2018 |
| CN | 111651387 | 9/2020 |

* cited by examiner

*Primary Examiner* — Farhana A Hoque
(74) *Attorney, Agent, or Firm* — JCIPRNET

(57) ABSTRACT

An operation method of a detection device and a detection device are provided. The detection device includes a first interface and a second interface. The operation method includes the following. A voltage signal is received through the first interface. A voltage value of the voltage signal is determined. One of a plurality of functional modules is selected according to the voltage value, so as to transmit a signal through the second interface.

20 Claims, 3 Drawing Sheets

DETECTION DEVICE AND OPERATION METHOD THEREOF

CROSS-REFERENCE TO RELATED APPLICATION

This application claims the priority benefit of Taiwan application serial no. 111127682, filed on Jul. 25, 2022. The entirety of the above-mentioned patent application is hereby incorporated by reference herein and made a part of this specification.

BACKGROUND

Technical Field

The disclosure relates to a device and an operation method thereof, and more particularly to a detection device and an operation method thereof.

Description of Related Art

A detection device installed with a network line is limited to be applied in network wiring to provide a signal transmission function. When the detection device is to operate in fields other than the network-related field, such as a maintenance inspection operation, a firmware programming operation, and/or a debug operation, the detection device must be disassembled to perform the maintenance operation and even coupled to additional lines for transmitted the related maintenance data. Therefore, the detection device encounters issues of difficulties in maintenance and requirements for additional lines, which leads to difficulties in performing the maintenance operation and increase in maintenance and operation costs.

SUMMARY

The disclosure provides a detection device and an operation method thereof, in which multi-functional data transmission may be achieved through one single interface.

According to an embodiment of the disclosure, an operation method adapted to a detection device is provided. The detection device includes a first interface and a second interface. The operation method includes the following. A voltage signal is received through the first interface. A voltage value of the voltage signal is determined. One of a plurality of functional modules is selected according to the voltage value, so as to determine a signal through the second interface.

According to an embodiment of the disclosure, a detection device including a first interface, a second interface, a comparator, and a switch is provided. The first interface is configured to receive a voltage signal. The second interface is configured to transmit a signal. The comparator is configured to receive the voltage signal and determine a voltage value of the voltage signal. The switch is configured to receive the voltage value of the voltage signal to select one of a plurality of functional modules, so as to transmit a signal through the second interface.

Based on the above, in the detection device and the operation method thereof provided in one or more embodiments of the disclosure, the functional module may be automatically selected according to the voltage value of the received voltage signal, and the signal having the corresponding data may be transmitted.

In order to make the above-mentioned features and advantages of the disclosure comprehensible, embodiments accompanied with drawings are described in detail below.

BRIEF DESCRIPTION OF THE DRAWINGS

The accompanying drawings, which are included to provide a further understanding of the disclosure, are incorporated in and constitute a part of this specification. The drawings illustrate embodiments of the disclosure and, together with the description, serve to explain the principles of the disclosure.

DESCRIPTION OF THE EMBODIMENTS

Figure 1:
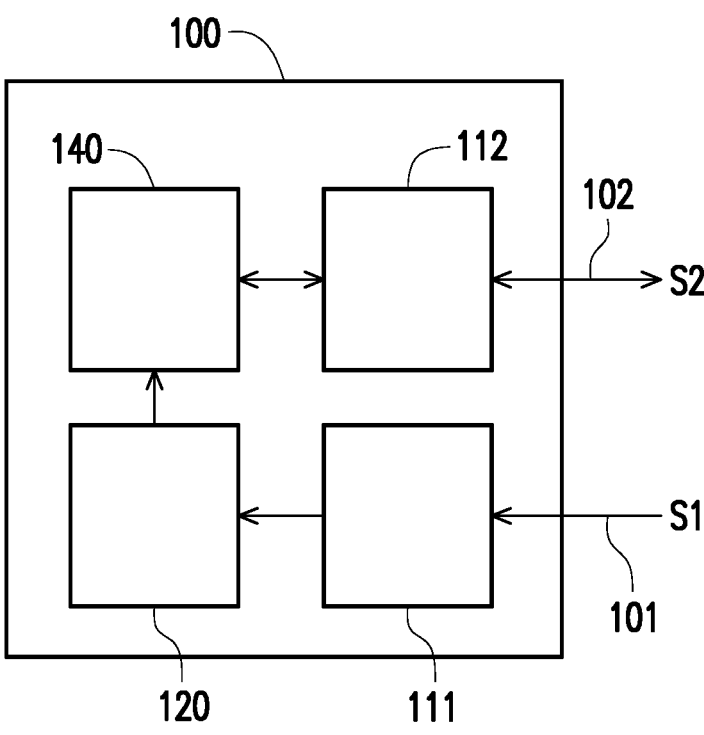
FIG. 1 is a schematic view of circuitry in a detection device according to an embodiment of the disclosure.

The disclosure will be understood by reference to the following detailed description when considered in connection with the accompanying drawings. It is to be noted that, for ease of understanding and simplicity of the drawings, some of the drawings of the disclosure only illustrate a part of an electronic device, and specific components in the drawings are not drawn according to actual scale. In addition, the number and size of each component in the drawings are only for schematic purposes and are not intended to limit the scope of the disclosure.

Certain terminologies may be used throughout the disclosure and the appended patent claims to refer to specific components. It should be understood by those of ordinary skill in the art that electronic device manufacturers may refer to the same component by different names. The disclosure does not intend to distinguish between components that have the same function but have different names.

In the following description and claims, the terminologies such as "include" and "comprise" are used in an open-ended fashion and thus should be interpreted to mean "including but not limited to . . . ".

It will be understood that when a component or layer is referred to as being "on" or "connected to" another component or layer, it may be directly on or directly connected to the another component or layer, or an intervening component or layer may be present between the two (indirect case). In contrast, when a component or layer is referred to as being "directly on" or "directly connected to" another component or layer, there is no intervening component or layer between the two.

Although terminologies such as "first", "second", "third" and the like may be used to describe various components, the components are not limited to these terminologies. These terminologies are used only to distinguish one component from another in the specification. The same terminologies are not necessarily used in the claims as in the description and may be replaced with first, second, third and the like according to the order in which the components are stated in the claims. Therefore, a first component in the following description may be a second component in the claims.

Terminologies such as "about", "approximately", "substantially," and "roughly" as used herein usually mean within 10%, 5%, 3%, 2%, 1%, or 0.5% of a given value or range. Every quantity given herein is an approximate quantity, that is, the meanings of the terminologies such "about", "approximately", "substantially" and "roughly" are implied even if the terminologies are not specifically used. Expressions such as "range of a first value to a second value" and "range of between a first value and a second value" mean that the range includes the first value, the second value, and other values therebetween.

In some embodiments of the disclosure, unless specifically defined, terminologies regarding bonding and connection, such as "connected" and "interconnected", may mean that two structures are in direct contact, or are not in direct contact and have other structures disposed therebetween. The terminologies regarding bonding and connection may also include a case where both structures are movable or both structures are fixed. In addition, the terminology "coupled" includes any direct and indirect electrical connection means.

It should be noted that, in the following embodiments, the features in several different embodiments may be replaced, reorganized, and mixed to complete other embodiments without departing from the spirit of the disclosure. As long as the features of the various embodiments do not violate the spirit of the disclosure or conflict with one another, they may be mixed and matched arbitrarily.

In some embodiments of the disclosure, the detection device may be, for instance, an electronic device including a processor and a memory and may be applied together with a personal computer (PC), a laptop, a tablet, a smart phone, or other devices, so as to be able to output image signals based on operations of a user. The processor may be a field programmable gate array (FPGA), a graphics processing unit (GPU), or any other suitable device. Besides, the processor may be configured to execute modules stored in a memory. The memory may be a dynamic random access memory (DRAM). The detection device will serve as an electronic device for outputting an image signal in the following description to explain the disclosure, which should however not be construed as a limitation in the disclosure.

FIG. 1 is a schematic view of circuitry in a detection device according to an embodiment of the disclosure. With reference to FIG. 1, a detection device 100 includes a first interface 111, a second interface 112, a comparator 120, and a switch 140. The first interface 111 is coupled to the comparator 120. The comparator 120 is further coupled to the switch 140. The second interface 112 is coupled to the switch 140. In this embodiment, the switch 140 may be a many-to-one switch. In this embodiment, the first interface 111 may be, for instance, a power transmission interface and may be coupled to an external transformer or an external power supply through a first connection line 101 to obtain a voltage signal, which should however not be construed as a limitation in the disclosure. The second interface 112 may be, for instance, a communication interface and may be coupled to an external electronic device through a second connection line 102, where the electronic device may be, for instance, a computer device, an adapter board, an equipment detection device, and so on, which should however not be construed as a limitation in the disclosure. In some embodiments of the disclosure, note that the first connection line 101 and the second connection line 102 may be integrated as one single transmission line capable of performing functions of power transmission and network communication transmission at the same time, which should however not be construed as a limitation in the disclosure.

In this embodiment, the detection device 100 may be, for instance, an X-ray detection device, and may obtain X-ray detection images, which should however not be construed as a limitation in the disclosure. In this embodiment, the detection device 100 may obtain a voltage signal S1 from the first connection line 101 through the first interface 111 and determine to execute a corresponding functional module according to a voltage value of the voltage signal S1. The detection device 100 may transmit a signal S2 to the external electronic device through the second interface while the detection device 100 is executing the corresponding functional module. The signal S2 may include, for instance, network data, device status data, or firmware data, where the network data may further include image data generated by the detection device 100 executing image detection, which should however not be construed as a limitation in the disclosure. In other words, the detection device 100 provided in this embodiment may execute different functional modules according to the voltage value of the received voltage signal S1 and may transmit related data to the external electronic device simply through the second interface 112.

Figure 2:
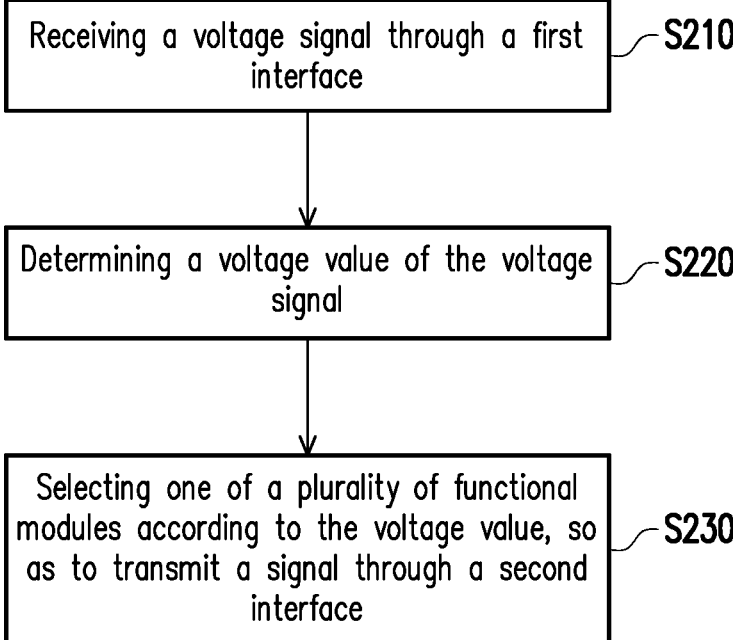
FIG. 2 is a flowchart of an operation method of a detection device according to an embodiment of the disclosure.

FIG. 2 is a flowchart of an operation method of a detection device according to an embodiment of the disclosure. With reference to FIG. 1 and FIG. 2, the detection device 100 depicted in FIG. 1 may execute steps S210 to S230 as follows. In step S210, the detection device 100 receives the voltage signal S1 through the first interface 111. In step S220, the detection device 100 determines a voltage value of the voltage signal S1. In this embodiment, the comparator 120 of the detection device 100 may output a switch signal to the switch 140 according to the voltage value of the voltage signal S1. In step S230, the detection device 100 may select a functional module according to the voltage value, so as to transmit the signal S2 through the second interface 112. In this embodiment, the switch 140 of the detection device 100 may switch a signal transmission channel in the detection device 100, and the detection device 100 may select to switch to execute one of a plurality of built-in functional modules according to the voltage value, so as to transmit the signal S2 corresponding to one of the functional modules through the second interface 112. The signal S2 includes data corresponding to one of the functional modules. The transmission of the signal S2 includes steps of receiving the signal S2 from the external electronic device by the detection device 100 through the second interface 112 and/or outputting the signal S2 to the external electronic device by the detection device 100 through the second interface 112. Therefore, the detection device 100 and the operation method thereof provided in this embodiment and may automatically execute the corresponding functional module according to the voltage value of the received voltage signal S1 and transmit the related signal simply through the second interface 112.

For instance, if the user intends to perform the detection function of the detection device 100, the user may couple the first connection line 101 that is coupled to the detection device 100 to a transformer or a power supply which is capable of detecting an operation voltage and couple the second connection line 102 that is coupled to the detection device 100 to an external electronic device, such as a computer device. Next, the comparator 120 of the detection device 100 may determine that the voltage signal S1 received by the first interface 111 has a first voltage value, such as the voltage value provided for the detection operation, so as to notify the switch 140 of switching to the signal transmission channel in the detection device 100; besides, the detection device 100 may execute the communication functional module. As such, the detection device 100 may transmit the signal S2 to the external electronic device through the second interface 112 and the second connection line 102, and the signal S2 includes network data. Moreover, when the detection device 100 obtains a detection image, the network data transmitted through the second connection line 102 may also include image data, which should however not be construed as a limitation in the disclosure. Therefore, the detection device 100 may provide the detection image to the external electronic device through the second interface 112 and the second connection line 102.

In another example, if the user intends to perform other functions of the detection device 100, such as the detection function, the debug function, or the firmware programming function, the user may couple the first connection line 101 of the detection device 100 to the transformer or the power supply capable of providing a second voltage value (different from the voltage value of the detection device 100 operating the detection function) and couple the second connection line 102 that is coupled to the detection device 100 to an external electronic device, such as a computer device, an adapter board, an equipment detection device, and so on, which should however not be construed as a limitation in the disclosure. Next, the comparator 120 of the detection device 100 may determine that the voltage signal S1 received through the first interface 111 has a second voltage value, so as to notify the switch 140 of switching to the signal transmission channel in the detection device 100, and the detection device 100 may execute a functional module corresponding to one of the detection function, the debug function, and the programming function. Thereby, the detection device 100 may transmit the signal S2 to the external electronic device through the second interface 112 and the second connection line 102, and the signal S2 includes, for instance, the status data or the firmware data of the detection device 100.

Figure 3:
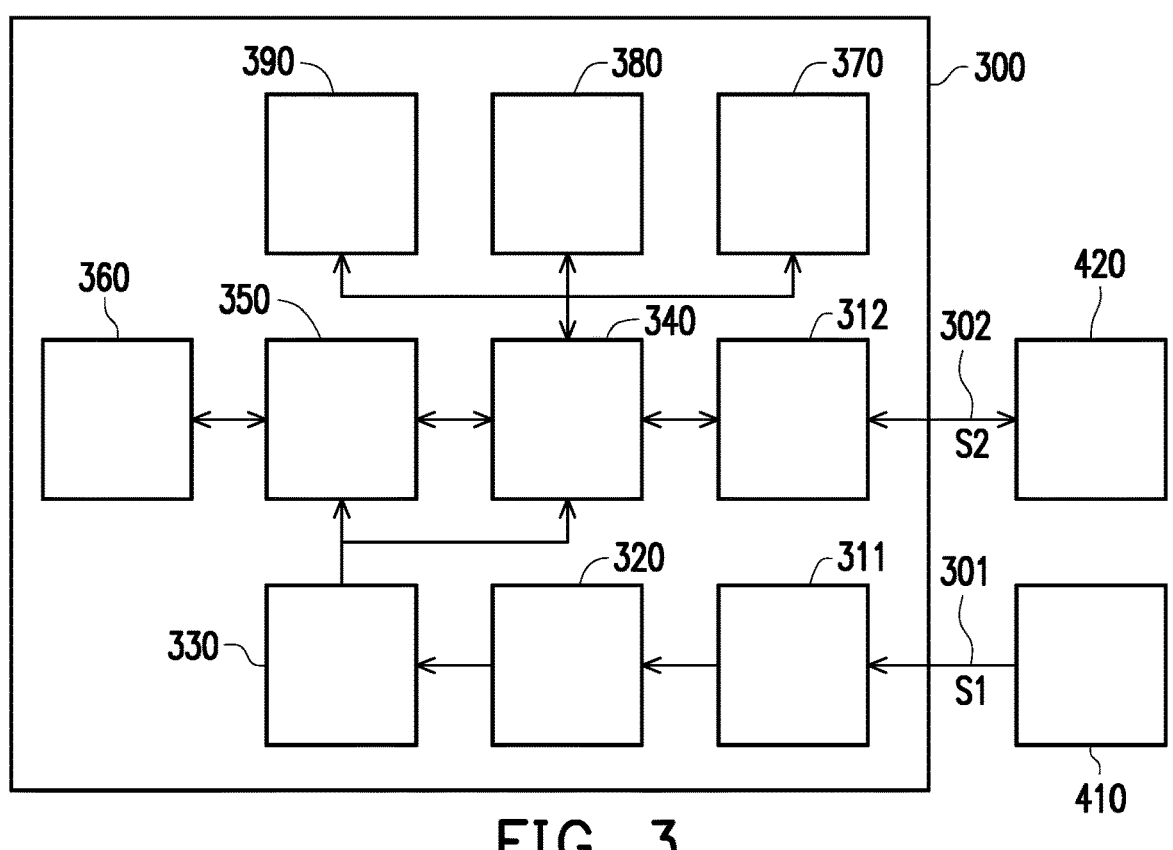
FIG. 3 is a schematic view of circuitry in a detection device according to another embodiment of the disclosure.

FIG. 3 is a schematic view of circuitry in a detection device according to another embodiment of the disclosure. With reference to FIG. 3, a detection device 300 includes a first interface 311, a second interface 312, a comparator 320, a logic determination device 330, a switch 340, a relay 350, a network isolation transformer 360, a detection module 370, a debug module 380, and a programming module 390. The network communication module may include the relay 350 and the network isolation transformer 360, which should however not be construed as a limitation in the disclosure. The first interface 311 is coupled to the comparator 320. The comparator 320 is further coupled to the logic determination device 330. The logic determination device 330 is further coupled to the switch 340 and the relay 350. The relay 350 is further coupled to the network isolation transformer 360 and the switch 340. The second interface 312 is coupled to the switch 340. The switch 340 is further coupled to the detection module 370, the debug module 380, and the programming module 390. In this embodiment, the switch 340 may be a many-to-one switch. The detection module 370, the debug module 380, and the programming module 390 may be respectively implemented by circuits with related functions and/or corresponding algorithms. In an embodiment, the logic determination device 330 may be a processor and may be configured to execute modules stored in the memory, and the logic determination device 330 may execute different functional modules according to a voltage value of a voltage signal received by the first interface 311.

In this embodiment, the detection module 370 may generate the status data of the detection device 300. In this regard, the detection module 370 may generate current status data according to a current status of related electronic devices and circuits within the detection device 300 and transmit the current status data to an external electronic device 420 through the switch 340 and the second interface 312.

In this embodiment, the debug module 380 may generate error data of the detection device 300. In this regard, the debug module 380 may be pre-installed in the detection device 300, for instance, and the debug module 380 may include a related debug algorithm to execute related detection operations on the related electronic devices and circuits in the detection device 300. The debug module 380 may generate current error data of the detection device 300 and transmit the current error data to the external electronic device 420 through the switch 340 and the second interface 312.

In this embodiment, the programming module 390 may, for instance, be configured to receive firmware data through the switch 340 and the second interface 312 to perform data programming and/or updating operations on the related firmware of the detection device 300.

In this embodiment, the first interface 311 may be, for instance, a power transmission interface and may be coupled to the external transformer 410 through the first connection line 301 to obtain a voltage signal. The first connection line 301 may be, for instance, a power line. The second interface 312 may be, for instance, a communication interface and may be coupled to the external electronic device 420 through a second connection line 302, wherein the description of the electronic device 420 may be referred to as the description provided in the previous embodiment and thus will not be repeated hereinafter. The second connection line 302 may be, for instance, a universal serial bus (USB) line or any other network line. In some of the embodiments of the disclosure, note that the first connection line 301 and the second connection line 302 may be integrated as one single line having both the power transmission function and the network communication transmission function.

In this embodiment, the detection device 300 may be, for instance, an X-ray detection device and may obtain X-ray detection images, which should however not be construed as a limitation in the disclosure. In this embodiment, the detection device 300 may obtain the voltage signal S1 from the first connection line 301 through the first interface 311 and may couple the second interface 312 to one of the relay 350, the detection module 370, the debug module 380, and the programming module 390 through the switch 340 according to the voltage value of the voltage signal S1, so as to determine to perform the function of one of the network communication module, the detection module 370, the debug module 380, and the programming module 390. In addition, in the process of executing the corresponding functional module, the detection device 300 may transmit the signal S2 to the external electronic device 420 through the second interface 312. In other words, the detection device 300 provided in the embodiment may receive the voltage signal S1 provided by the external transformer 410 simply through the first interface 311 and the first connection line 301 and select to perform one of the network communication function, the detection function, the debug function, and the programming function according to the voltage value of the voltage signal S1. In addition, the detection device 300 provided in the embodiment may further transmit related data to the external electronic device 420 simply through the second interface 312 and the second connection line 302.

Figure 4:
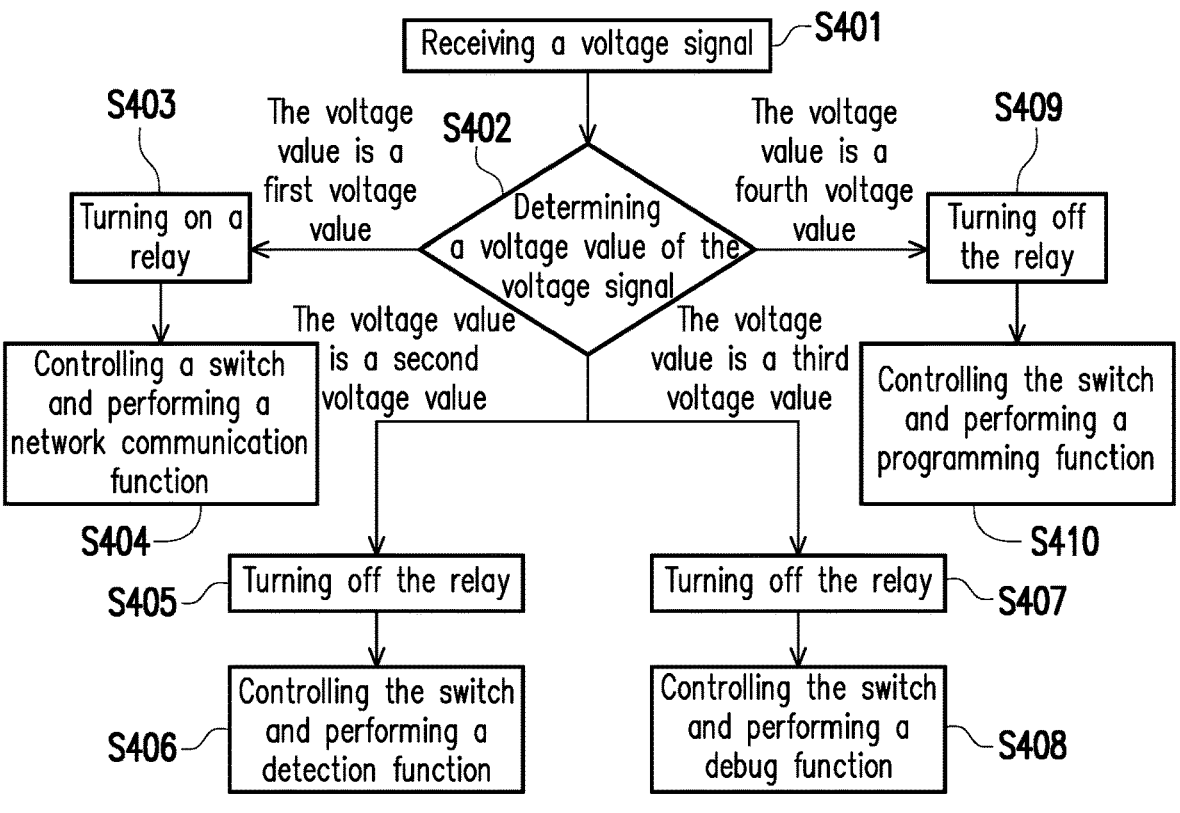
FIG. 4 is a flowchart of an operation method of a detection device according to another embodiment of the disclosure.

FIG. 4 is a flowchart of an operation method of a detection device according to another embodiment of the disclosure. With reference to FIG. 3 and FIG. 4, the detection device 300 depicted in FIG. 3 may execute steps S401 to S410 as follows. In step S401, the detection device may receive the voltage signal S1 from the transformer 410 through the first interface 311 and the first transmission line 301. In step S402, the comparator 320 may receive the voltage signal S1 and output a comparison signal to the logic determination device 330 to determine the voltage value of the voltage signal S1.

Given that the voltage value is a first voltage value (e.g., 20 volts), for instance, when the logic determination device 330 determines that the voltage value of the voltage signal S1 is the first voltage value (or is close to the first voltage value), in step S403, the logic determination device 330 may output a determination result to the relay 350 to turn on the relay 350 and turn on the signal transmission channel between the relay 350 and the network isolation transformer 360 to select the network communication module for performing a network communication function. In step S404, the logic determination device 330 may output the determination result to the switch 340, so that the switch 340 turns on the signal transmission channel between the switch 340 and the relay 350, and the detection device 300 performs the network communication function. As such, the network isolation transformer 360 may provide network data to the external electronic device 420 or receive the network data from the external electronic device 420 through the relay 350, the switch 340, the second interface 312, and the second connection line 302, and the network isolation transformer 360 may further integrate the image data generated by the detection device 300 executing the image detection into the network data and provide the integrated data to the electronic device 420. In this embodiment, the network isolation transformer 360 may be configured to transmit the network communication signal to the related communication module in the detection device 300 or output the communication signal provided by the related communication module in the detection device 300.

Given that the voltage value is a second voltage value (e.g., 16 volts), for instance, when the logic determination device 330 determines that the voltage value of the voltage signal S1 is the second voltage value (or close to the second voltage value), in step S405, the logic determination device 330 may output the determination result to the relay 350 to turn off the relay 350 and turn off the signal transmission channel between the switch 340 and the relay 350. In step S406, the logic determination device 330 may control the switch 340 according to the determination result, so as to turn on the signal transmission channel between the switch 340 and the detection module 370 and enable the detection device 300 to perform a detection function of the detection module 370. As such, the detection module 370 may generate the current status data of the detection device 300 and may transmit the current status data to the external electronic device 420 through the switch 340 and the second interface 312.

Given that the voltage value is a third voltage value (e.g., 12 volts), for instance, when the logic determination device 330 determines that the voltage value of the voltage signal S1 is the third voltage value (or close to the third voltage value), in step S407, the logic determination device 330 may output the determination result to the relay 350 to turn off the relay 350 and turn off the signal transmission channel between the switch 340 and the relay 350. In step S408, the logic determination device 330 may control the switch 340 according to the determination result to turn on the signal transmission channel between the switch 340 and the debug module 380 and enable the detection device 300 to perform a debug function of the debug module 380. As such, the debug module 380 may generate current error data of the detection device 300 and may transmit the current error data to the external electronic device 420 through the switch 340 and the second interface 312.

Given that the voltage value is a fourth voltage value (e.g., 8 volts), for instance, when the logic determination device 330 determines that the voltage value of the voltage signal S1 is the fourth voltage value (or close to the fourth voltage value), in step S409, the logic determination device 330 may output the determination result to the relay 350 to turn off the relay 350 and turn off the signal transmission channel between the switch 340 and the relay 350. In step S410, the logic determination device 330 may control the switch 340 according to the determination result to turn on the signal transmission channel between the switch 340 and the programming module 390 and enable the detection device 300 to perform a programming function of the programming module 390. As such, the programming module 390 may be configured to receive firmware data through the switch 340 and the second interface 312, for instance, and may perform data programming and/or updating operations on the related firmware of the detection device 300 according to the received firmware data.

In other words, users or equipment maintenance personnel may provide voltage signals with different voltage values through different transformers according to different usage requirements and provide the voltage signals to the detection device 300 through the first interface 311 and the first connection line 301 to effectively switch the operation status of the detection device 300. In addition, the detection device 300 may transmit the data generated and/or required by the detection device 300 on various operation conditions through the second interface 312 and the second connection line 302.

Figure 5:
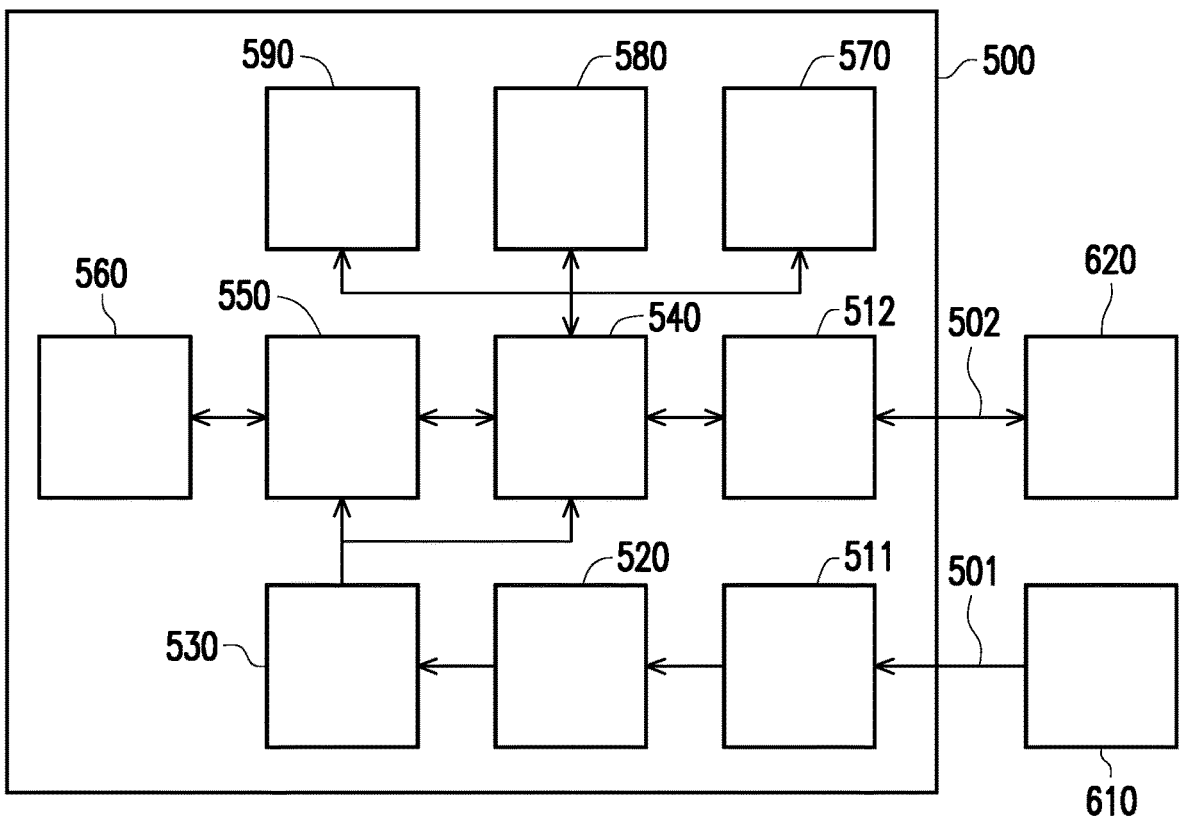
FIG. 5 is a schematic view of circuitry in a detection device according to still another embodiment of the disclosure.

FIG. 5 is a schematic view of circuitry in a detection device according to still another embodiment of the disclosure. With reference to FIG. 5, a detection device 500 provided in this embodiment includes a first interface 511, a second interface 512, a voltage detector 520, a controller 530, a switch 540, a signal isolator 550, a network isolation transformer 560, a detection module 570, a debug module 580, and a programming module 590. The network communication module may include the signal isolator 550 and the network isolation transformer 560, which should however not be construed as a limitation in the disclosure. The controller 530 may be a microcontroller (MCU), which should however not be construed as a limitation in the disclosure. The first interface 511 is coupled to the voltage detector 520. The voltage detector 520 is further coupled to the controller 530. The controller 530 is further coupled to the switch 540 and the signal isolator 550. The signal isolator 550 is further coupled to the network isolation transformer 560 and the switch 540. The second interface 512 is coupled to the switch 540. The switch 540 is further coupled to the detection module 570, the debug module 580, and the programming module 590.

In this embodiment, the voltage detector 520, the controller 530, and the signal isolator 550 may be respectively implemented by, for instance, a programmable logic device (PLD) or a similar logic circuit that may be adjusted by software, which should however not be construed as a limitation in the disclosure. In this embodiment, the voltage detector 520 may determine the voltage value of the voltage signal S1 received by the detection device 500 through the first interface 511, and the voltage detection result is provided to the controller 530. The controller 530 may control the signal isolator 550 according to the result of the voltage detection to determine whether to turn on the signal transmission channel between the switch 540 and the signal isolator 550 to select the network communication module for performing the network communication operation. In addition, the controller 530 may control the switch 540 according to the result of the voltage detection to conduct the second interface 512 to the functional module of one of the signal isolator 550, the detection module 570, the debug module 580, and the programming module 590 through the switch 540 and perform one of the network communication function, the detection function, the debug function, the programming function, and other functions.

Therefore, the detection device 500 provided in this embodiment may also be implemented to select to perform one of the network communication function, the detection function, the debug function, the programming function, and other functions according to the voltage value of the voltage signal S1 provided by an external transformer 610 and received through the first interface 511 and the first connection line 501, and the detection device 500 may also transmit related data to the external electronic device 620 through the second interface 512 and the second connection line 502. In addition, descriptions of the related technical features and technical contents of other internal circuits and modules of the detection device 500 provided in the embodiment may be referred to as the description provided in the embodiments depicted in FIG. 1 to FIG. 4 above and thus will not be further provided hereinafter.

To sum up, the detection device and the operation method thereof according to one or more embodiments of the disclosure allow users or equipment maintenance personnel to provide the voltage signals with different voltage values through different transformers according to different usage requirements, and the voltage signals are provided to the detection device simply through the first interface and the first connection line, so as to effectively switch the operation status of the detection device and achieve convenient device maintenance. Moreover, the detection device provided in one or more embodiments of the disclosure may transmit the data generated by the detection device on various operation conditions simply through the second interface and the second connection line. Therefore, the detection device provided in one or more embodiments of the disclosure may performing the switching operation in a multi-function manner with ease, and the number and cost of lines may be effective saved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An operation method of a detection device, wherein the detection device comprises a first interface, a second interface, a comparator, and a switch, wherein the first interface is a power transmission interface, and the second interface is a communication interface, and the operation method comprises:

receiving different signals with different voltage values through the first interface;

receiving the different voltage values and outputting a switch signal according to the different voltage values through the comparator;

receiving the switch signal and selecting one of a plurality of functional modules according to one of the plurality of voltage values through the switch; and transmitting a signal corresponding to the selected functional module through the second interface.

2. The operation method according to claim 1, wherein the one of the plurality of functional modules is a network communication module, the signal comprises network data, and the network data comprises image data.

3. The operation method according to claim 1, wherein the one of the plurality of functional modules is a detection module, and the signal comprises status data of the detection device.

4. The operation method according to claim 1, wherein the one of the plurality of functional modules is a programming module, and the signal comprises firmware data.

5. The operation method according to claim 1, wherein the one of the plurality of functional modules is a debug module, and the signal comprises debug data of the detection device.

6. The operation method according to claim 1, wherein the first interface receives the voltage signal through a first connection line, and the second interface transmits the signal through a second connection line.

7. The operation method according to claim 1, wherein the step of selecting one of the functional modules according to the voltage value, so as to transmit the signal through the second interface comprises:

controlling, through a logic determination device, a switch to turn on a signal transmission channel between one of the functional modules and the second interface according to the voltage value.

8. The operation method according to claim 1, wherein the step of selecting the one of the plurality of functional modules comprises:

controlling, through a controller, the switch according to the one of the plurality of voltage values, so as to conduct the second interface to the one of the plurality of functional modules through the switch.

9. The operation method according to claim 1, wherein the step of transmitting the signal corresponding to the selected functional module comprises:

when a first voltage is received by the first interface, transmitting a first signal corresponding to a first functional module through the second interface; and when a second voltage is received by the first interface, transmitting a second signal corresponding to a second functional module through the second interface, wherein the first voltage and the second voltage are different, and the first functional module and the second functional module are different.

10. A detection device, comprising:

a first interface, wherein the first interface is a power transmission interface configured to receive different signals with different voltage values;

a second interface, configured to transmit the different signals;

a comparator, configured to receive the different voltage values and output a switch signal according to the different voltage values;

a switch, configured to receive the switch signal and to select one of a plurality of functional modules according to one of the plurality of voltage values, wherein the second interface is a communication interface configured to transmit a signal corresponding to the selected functional module.

11. The detection device according to claim 10, wherein the one of the plurality of functional modules is a network communication module, and the signal comprises network data.

12. The detection device according to claim 11, wherein the network data comprises image data.

13. The detection device according to claim 10, wherein the one of the plurality of functional modules is a detection module, and the signal comprises status data of the detection device.

14. The detection device according to claim 10, wherein the one of the plurality of functional modules is a programming module, and the signal comprises firmware data.

15. The detection device according to claim 10, wherein the one of the plurality of functional modules is a debug module, and the signal comprises debug data of the detection device.

16. The detection device according to claim 10, wherein the first interface receives the voltage signal through a first connection line, and the second interface transmits the signal through a second connection line.

17. The detection device according to claim 16, wherein the first connection line and the second connection line are integrated as one single transmission line.

18. The detection device according to claim 10, further comprising:

a logic determination device, coupled to the comparator and the switch and configured to control the switch to turn on a signal transmission channel between one of the functional modules and the second interface according to the voltage value.

19. The detection device according to claim 10, further comprising:

a controller, coupled to the comparator and the switch and configured to control the switch according to the one of the plurality of voltage values, so as to conduct the second interface to the one of the plurality of functional modules through the switch.

20. The detection device according to claim 10, wherein when a first voltage is received by the first interface, the second interface transmit a first signal corresponding to a first functional module, wherein when a second voltage is received by the first interface, the second interface transmit a second signal corresponding to a second functional module, wherein the first voltage and the second voltage are different, and the first functional module and the second functional module are different.

\* \* \* \* \*